(12) United States Patent
Anderson et al.

(10) Patent No.: US 7,473,523 B2
(45) Date of Patent: Jan. 6, 2009

(54) SYSTEMS AND METHODS FOR MODIFYING FEATURES IN A SEMI-CONDUCTOR DEVICE

(75) Inventors: Brent A. Anderson, Jericho, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 11/161,624

(22) Filed: Aug. 10, 2005

(65) Prior Publication Data

US 2007/0037098 A1  Feb. 15, 2007

(51) Int. Cl.
*G03F 7/26* (2006.01)
(52) U.S. Cl. ............... 430/394; 430/311; 430/396
(58) Field of Classification Search .................. 430/5, 430/311, 394, 396
See application file for complete search history.

(56) References Cited

U.S. PATENT DOCUMENTS

| 5,387,484 | A | 2/1995 | Doany et al. |
|---|---|---|---|
| 2003/0165749 | A1 | 9/2003 | Fritze et al. |
| 2004/0063038 | A1 | 4/2004 | Shin et al. |
| 2004/0161679 | A1 | 8/2004 | Dai et al. |
| 2004/0170906 | A1 | 9/2004 | Chen et al. |
| 2004/0202943 | A1 | 10/2004 | Dettmann et al. |
| 2006/0204859 | A1* | 9/2006 | Leidy et al. ............ 430/5 |

FOREIGN PATENT DOCUMENTS

JP  60-49338  3/1985

* cited by examiner

*Primary Examiner*—Kathleen Duda
(74) *Attorney, Agent, or Firm*—Scully, Scott, Murphy & Presser P.C.; Richard M. Kotulak, Esq.

(57) ABSTRACT

Systems and methods for modifying features of a semiconductor device. The systems and methods of the invention modify features of a semiconductor device according to the amount of exposure dose of light to which a common reticle field of a semiconductor device is exposed. A mask, or a thin film provided on a mask, having sub-resolutions provided thereon determines the amount of exposure dose to which various parts of the reticle field is exposed during the exposure. As a result, different features within the same reticle field can exhibit different dimensions even though exposed to the same exposure dose.

17 Claims, 6 Drawing Sheets

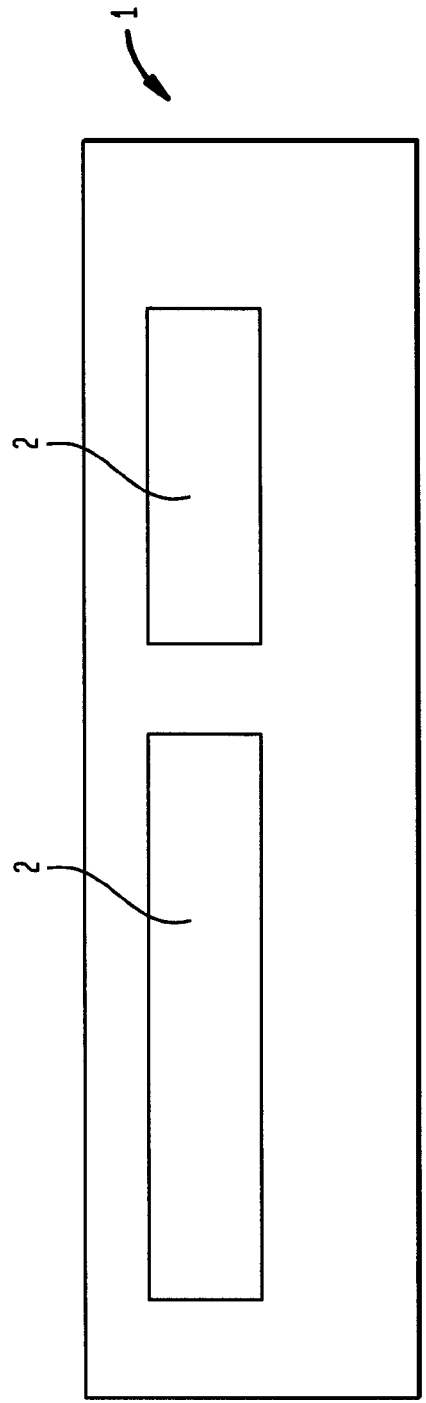
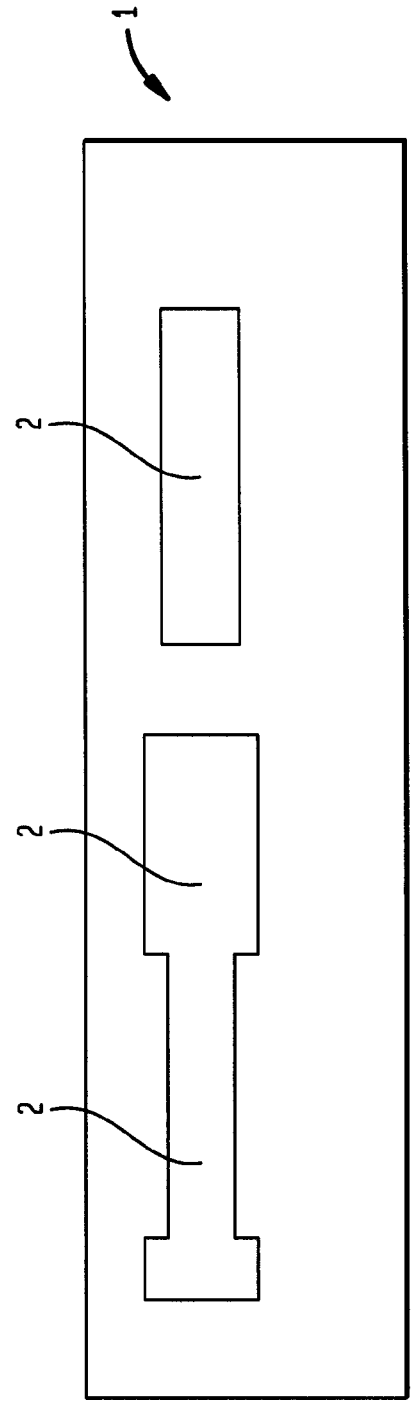

SYSTEMS AND METHODS FOR MODIFYING FEATURES IN A SEMI-CONDUCTOR DEVICE

BACKGROUND OF THE INVENTION

1. Field of the Invention

The invention generally relates to systems and methods for modifying features in a semi-conductor device to enhance semi-conductor chip performance. More specifically, the invention relates to systems and methods that modify features within a common reticle field using a common exposure dose.

2. Related Art

Critical Dimension (CD) control, especially for FET transistor gate level or semiconductor devices are becoming more and more important as technology requirements are becoming more stringent. Using current lithographic techniques, including Optical Proximity Correction (OPC), model building and masks are increasingly difficult and expensive to build. Moreover, inherent variabilities in mask manufacturing processes exist that can exhibit themselves in inconsistent dimensions from device to device, or from region to region in a single device. Methods and systems rendering modifications to features already imparted to a device would thus prove a meaningful asset to the industry.

There are currently many sources for systematically varying linewidth features, for example, within a common reticle field of semiconductor devices. Exposure control, for example, results in the same doses of light being applied to resist throughout a full reticle field in current practices. Such dosing tends to increase or decrease all linewidths in the reticle field to the same degree however. Lower chip performance tends to occur as a result. Moreover, other means to vary or adjust linewidths, other features, or critical dimensions differently with a common reticle field tend to be more complex or more costly to implement than is ideally preferred.

More recently, as set forth in co-pending U.S. patent application Ser. No. 10/906,846 (IBM Ref.: BUR920040189US1), of common assignment herewith, double exposure techniques have been developed using a low transmission mask. In such double exposure techniques, different semiconductor features are modified at selected areas within the common reticle field by a second exposure dose that is transmitted to the photoresist through the low transmission mask. The modifications tend to be binary according to the features of the low transmission mask, wherein modified areas of the photoresist have been exposed to the dose through the low transmission mask and non-modified areas of photoresist are not exposed to the dose. While this technique tends to improve chip performance by modifying features within a common field, at least one additional mask and exposure would be required to vary features further within the common reticle field. Moreover, other systems and methods for modifying features within a common reticle field tend to be more complex or more costly, or both, than is preferred.

In view of the above, a need exists for systems and methods that modify features within a common reticle field during a common exposure dose in a simple and cost effective manner.

SUMMARY OF THE INVENTION

The systems and methods of the invention modify features of a semiconductor device according to the amount of exposure dose of light to which a common reticle field of a semiconductor device is exposed. A mask, or a thin film provided on a mask, having sub-resolution features provided thereon determines the amount of exposure dose to which various parts of the reticle field is exposed during the exposure. The features are modified during the same exposure dose. As a result, different features within the same reticle field can exhibit a change in dimension even though exposed to the same exposure dose.

In a preferred embodiment of the systems and methods of the invention, varied features are imparted to the reticle field of a semiconductor device using two exposure doses. According to the preferred embodiment, a substrate is provided with a gate conductive material and a photoresist is applied thereto. The photoresist is subjected to a first exposure dose through a main mask yielding a first pattern to photoresist of the semiconductor device. The first pattern is generally a standard pattern of features. Thereafter, and prior to developing the photoresist, the first mask is replaced with a second mask, and a second exposure dose is applied through the second mask to the photoresist. The second mask is a low transmission mask having sub-resolution features provided thereon. Different patterns in the sub-resolution features modify different portions of the exposed photoresist differently within the same reticle field during the second exposure dose. The patterns in the sub-resolution features may vary from continuously solid portions, spaced apart solid portions, open portions, holed or dotted portions, slotted portions or combinations thereof. The pattern imparted onto the photoresist of the semiconductor device can thus increase or decrease as a result of the exposure dose applied, depending on whether the photoresist is positive or negative, respectively.

In another embodiment of the systems and methods of the invention, the modified features within a common reticle field are achieved using a single exposure dose applied through a single mask. The semiconductor device is prepared as before to have the gate conductive material and photoresist applied thereon. The mask is provided with a chrome side and a non-chrome side, as known in the art. The chrome side of the mask includes a main pattern. The non-chrome side includes a low transmission thin film with sub-resolution features arranged therein. The sub-resolution features provided within the thin film can have various patterns, such as continuously solid portions, spaced apart solid portions, holed or dotted portions, slotted portions or combinations thereof. Features of varied dimensions are thus imparted to the photoresist through the sub-resolution features of the single mask's thin film during the same exposure dose.

By varying the exposure dose in selected regions of a semiconductor device according to the systems and methods of the invention, the semiconductor device may be adjusted or "tuned" to better achieve the intended linewidth, spacing or other critical dimensions for the device. Such adjustments or "tuning" of the semiconductor device as the device is manufactured tends to enhance performance of the device. Further, systematic issues, such as mask ACLV, pattern density, voltage drop, or other design issues can be minimized.

The above and other features of the invention, including various novel details of construction and combinations of parts, will now be more particularly described with reference to the accompanying drawings and claims. It will be understood that the various exemplary embodiments of the invention described herein are shown by way of illustration only and not as a limitation thereof. The principles and features of this invention may be employed in various alternative embodiments without departing from the scope of the invention.

BRIEF DESCRIPTION OF THE DRAWINGS

These and other features, aspects, and advantages of the apparatus and methods of the present invention will become better understood with regard to the following description, appended claims, and accompanying drawings where:

FIG. 4b illustrates a view of a semiconductor device having a pattern of features imparted to the photoresist thereon prior to a second exposure.

FIG. 4c illustrates a view of a semiconductor device having a pattern of features imparted to the photoresist thereon after a second exposure.

DETAILED DESCRIPTION OF THE INVENTION

Figure 1:
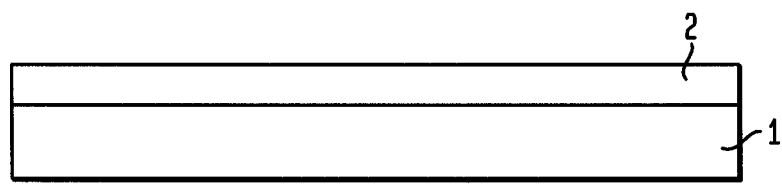
FIG. 1 illustrates a standard semiconductor wafer with photoresist thereon for processing according to the invention.

FIG. 1 illustrates a semiconductor device 1, such as a wafer, having a photoresist material 2 coated thereon in conventional manner. The artisan will appreciate that, prior to application of the photoresist, the semiconductor device is prepared and primed to enhance adhesion of the photoresist to the semiconductor device in a uniform thickness with minimal, or ideally no, particulate contamination as is practiced in the art.

The photoresist is an organic compound that experiences a change in solubility in a developer solution when exposed to ultraviolet (UV) light according to the systems and methods of the invention. The photoresist can be a positive photoresist, whereby unmasked regions of photoresist exposed to UV light are rendered more soluble and easily washed away by the developer solution. The non-exposed or masked portions of positive photoresist thus remain on the semiconductor device as the patterned features. Alternatively, the photoresist can be a negative photoresist, whereby unmasked regions of the photoresist exposed to UV light become cross-linked and hardened, i.e., less soluble. Masked portions of the negative photoresist thus remain more soluble and are able to be subsequently etched away, leaving only those less soluble hardened portions of the photoresist as the patterned features on the semiconductor device. Features initially patterned onto the photoresist are thus more easily increased when negative photoresist is used as additional cross-linking and hardening of initial features may be achieved using a second mask that increases the amount of negative photoresist exposed to UV light. The systems and methods of the invention are thus generally described herein using positive photoresist, although the artisan should readily appreciate that, in view of the above, negative photoresist could as well be used to modify features of a semiconductor device.

Figure 2A:
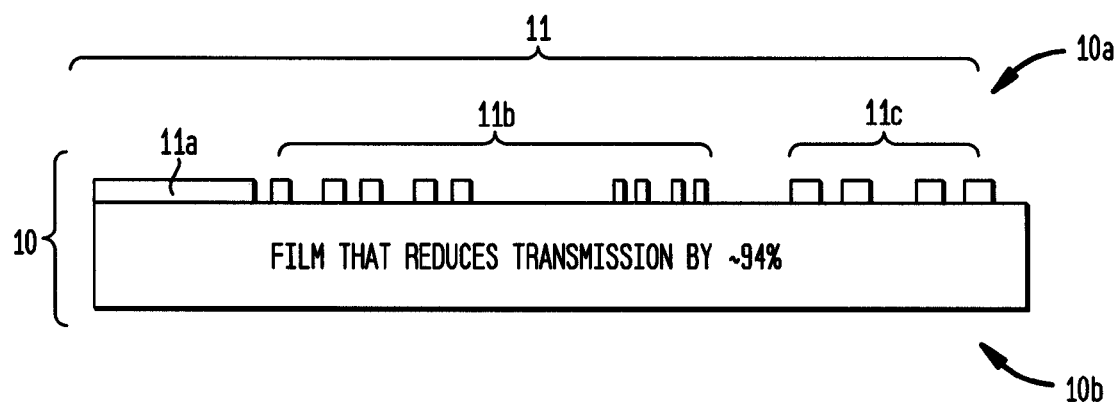
FIG. 2a illustrates a cross-sectional view of a low transmission mask having sub-resolution features provided thereon for modifying features of a semiconductor device according to a first embodiment of the systems and methods of the invention.

FIG. 2a illustrates a low transmission mask 10 for use with the semiconductor device 1 of FIG. 1, for example, after the photoresist 2 has been subjected to a first exposure dose through a first mask (not shown). The first mask and exposure dose creates a first pattern of standard features on the photoresist 2 in conventional manner. The features resulting from the first exposure dose through the main mask may then be tested to determine whether the given features would provide optimal semiconductor performance. Such performance may be characterized as a predetermined range within which the features are ideally within. If the features are determined by testing to be beyond the acceptable range, then a second mask 10 may be built to modify the features resulting from the main mask by subjecting the photoresist 2 to a second exposure dose.

Referring still to FIG. 2a, the second mask 10 is independently built to comprise a chrome side 10a and a non-chrome side 10 b as is common in the art. The chrome side 10a, however, is patterned with sub-resolution features 11 (i.e., and, as is clearly illustrated in FIG. 2a, only sub-resolution features) that permit various amounts of UV light to be transmitted through the mask 10 and to the photoresist 2 on the semiconductor device 1. The sub-resolution features 11 permit the second, or adjusting, dose to be averaged over the pattern, which minimizes line roughness. The second mask 10 may also be imaged out of focus to farther minimize line roughness. Minimizing line roughness in this manner tends to provide more subtle transitions between the patterned regions on a device. The sub-resolution features 11 of the mask 10 are shown in FIG. 2a as comprising a continuousty solid portion 11a, a group of dotted or holed portions 11b, and a group of spaced apart solid portions 11c. Of course, as the artisan should readily appreciate, other configurations and portions of sub-resolution features may comprise the mask 10 according to the systems and methods of the invention.

Still referring to FIG. 2a, the solid portion 11a of the sub-resolution feature 11 generally precludes the transmission of UV light to the photoresist 2. The main pattern imparted to the photoresist 2 by the first mask is thus retained where the second mask 10 has continuously solid portions 11a overlying that region of the main pattern. Of course, where the continuously solid portion 11a sub-resolution feature of the second mask is larger than the main pattern already imparted to the photoresist 2 and the photoresist is a positive photoresist, then that region of the main pattern is decreased when the second exposure dose occurs due to the breaking of links and increased solubility of the photoresist 2 subjected to the second exposure dose.

Likewise, the holed or dotted portions 11b or spaced solid portions 11c of the sub-resolution features 11 generally permit varying amounts of UV light to be transmitted therethrough to the main patterned photoresist 2. Where the mask 10 has such openings or spaced portions thorugh which a second exposure dose of UV light may be transmitted to the photoresist, the main pattern of the photoresist 2 is altered to correspond to the sub-resolution features 11 of the second mask 10. As before, where positive photoresist is used, subjecting more of the main patterned photoresist to UV light through the second exposure dose tends to decrease the feature dimensions on the photoresist. The features resulting from the second exposure dose, thus are modifications to the first imparted main pattern of features and are effectively a second pattern of features imparted to the photoresist.

Because the amount of UV light transmitted through the sub-resolution features of the second mask can vary from none to all, the second pattern of features can impart different changes in dimensions to different regions of the photoresist during the same second exposure dose. Small adjustments or "tuning" of linewidths, spacing or other critical dimensions of the pattern of features on the photoresist of the semiconductor device can be achieved as a result.

Figure 2B:
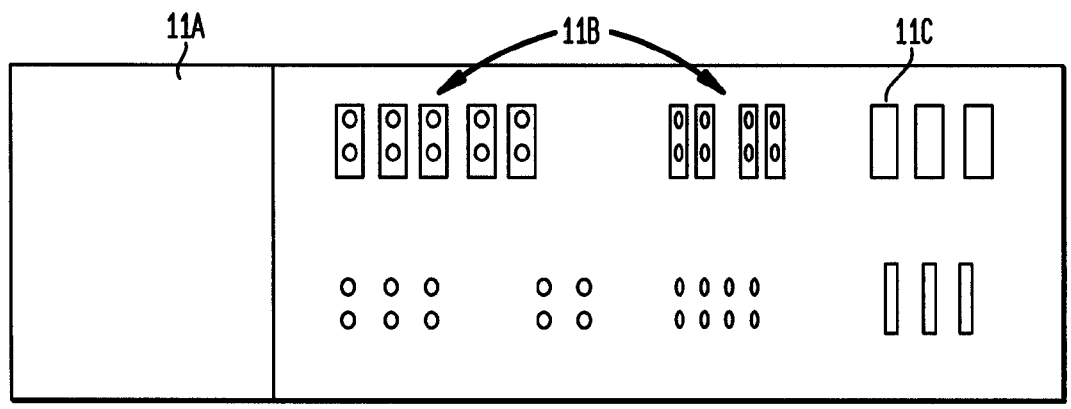
FIG. 2b illustrates a top view of the mask of FIG. 2a having a pattern of sub-resolution features imparted thereon.

FIG. 2b illustrates a top view of the second mask 10 of FIG. 2a with the sub-resolution features imparted thereon. The features imparted to the underlying photoresist 2 (not shown in FIG. 2b) through the mask 10 thus generally correspond to the sub-resolution features 11a-11c of the mask 10. As shown in FIG. 2b, the mask 10 has a continuously solid portion 11a, dotted or holed portions 11b, and spaced apart solid portions 12c. Of course, the artisan will readily appreciate that the features imparted to the semiconductor device 1 may be altered by varying the sub-resolution features 11 formed on the mask 10 as described above. The standard features first imparted to the photoresist by the first mask may have been smaller or larger than the second pattern of features eventually imparted to the photoresist 2 of the semiconductor device 1 through the second mask 10 as shown in FIG. 2b. Of course, patterning modifications could have been accomplished using a negative photoresist as well.

As is evident from FIGS. 2a & 2b in particular, use of the second mask 10 and the sub-resolution features 11 provided thereon permits varying amounts of UV light to be transmitted to different regions of the underlying photoresist during the same exposure dose of UV light. The pattern of features first imparted onto the semiconductor device 1 from the main mask, may thus be modified to achieve intended linewidths, spacing or other critical dimensions of the semiconductor device.

Figure 2C:
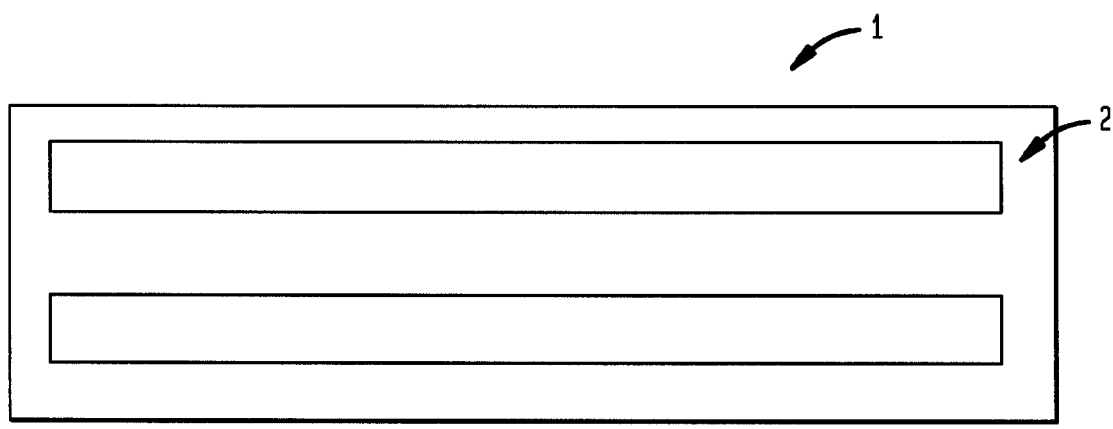
FIG. 2c illustrates a semiconductor device with resist thereon prior to a second exposure.
Figure 2D:
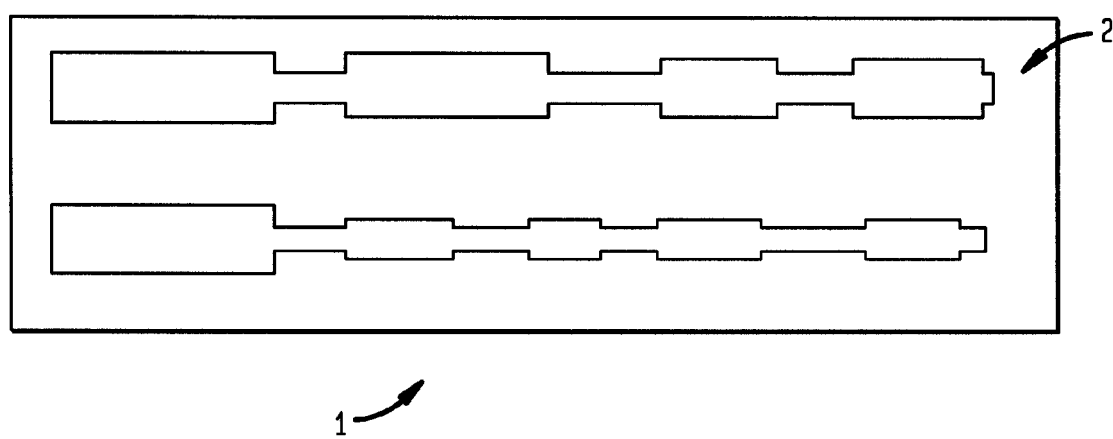
FIG. 2d illustrates a semiconductor device with resist thereon after a second exposure

FIG. 2c illustrates a semiconductor device 1 with resist 2 thereon prior to a second exposure. FIG. 2d on the other hand, illustrates a semiconductor device 1 with resist 2 thereon after a second exposure.

Figure 3:
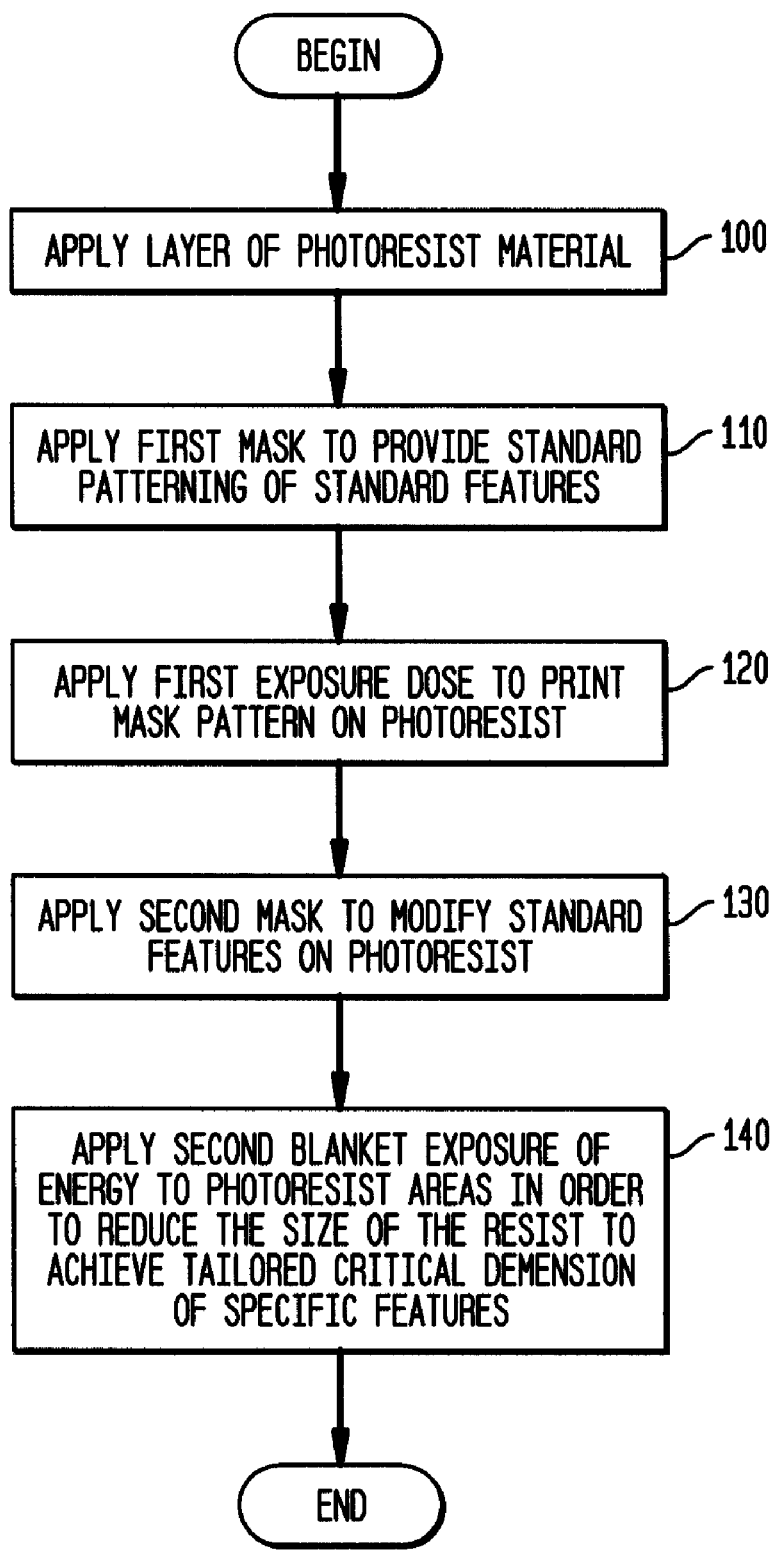
FIG. 3 illustrates a flow chart setting forth the method of modifying features of a semiconductor device using the mask of FIG. 2a according to the systems and methods of the invention.

FIG. 3 illustrates a flowchart of one method of modifying features on a semiconductor device using a mask similar to the mask 10 of FIG. 2a according to one embodiment of the systems and methods of the invention. Understood in the method set forth in the flowchart of FIG. 3 is that the a conventionally cleaned and primed semiconductor device 1, such as a wafer, is provided prior to applying the photoresist in Step 100 of FIG. 3. Thereafter, in Step 110, a first mask is provided over the photoresist. The first mask provides the main pattern of features, which tend to be standard features, as discussed above. Then, in Step 120, a first exposure dose of UV light is applied to the photoresist through the first mask. The intended standard first pattern of features is thus imparted to the photoresist. After removal of the first mask, Step 130 provides a second mask over the photoresist. The second mask has the sub-resolution features, for example as discussed above with respect to FIGS. 2a & 2b. Next, in Step 140, a second exposure of UV light is transmitted to the photoresist through the second mask and sub-resolutions provided thereon. The second exposure dose of UV light helps to achieve intended linewidths, spacing, or other critical dimensions in the photoresist of the semiconductor device. Thereafter, the process according to the systems and methods of the invention end, wherein it is understood that the semiconductor device with modified features is then hard-baked and further processed in conventional manner.

Figure 4A:
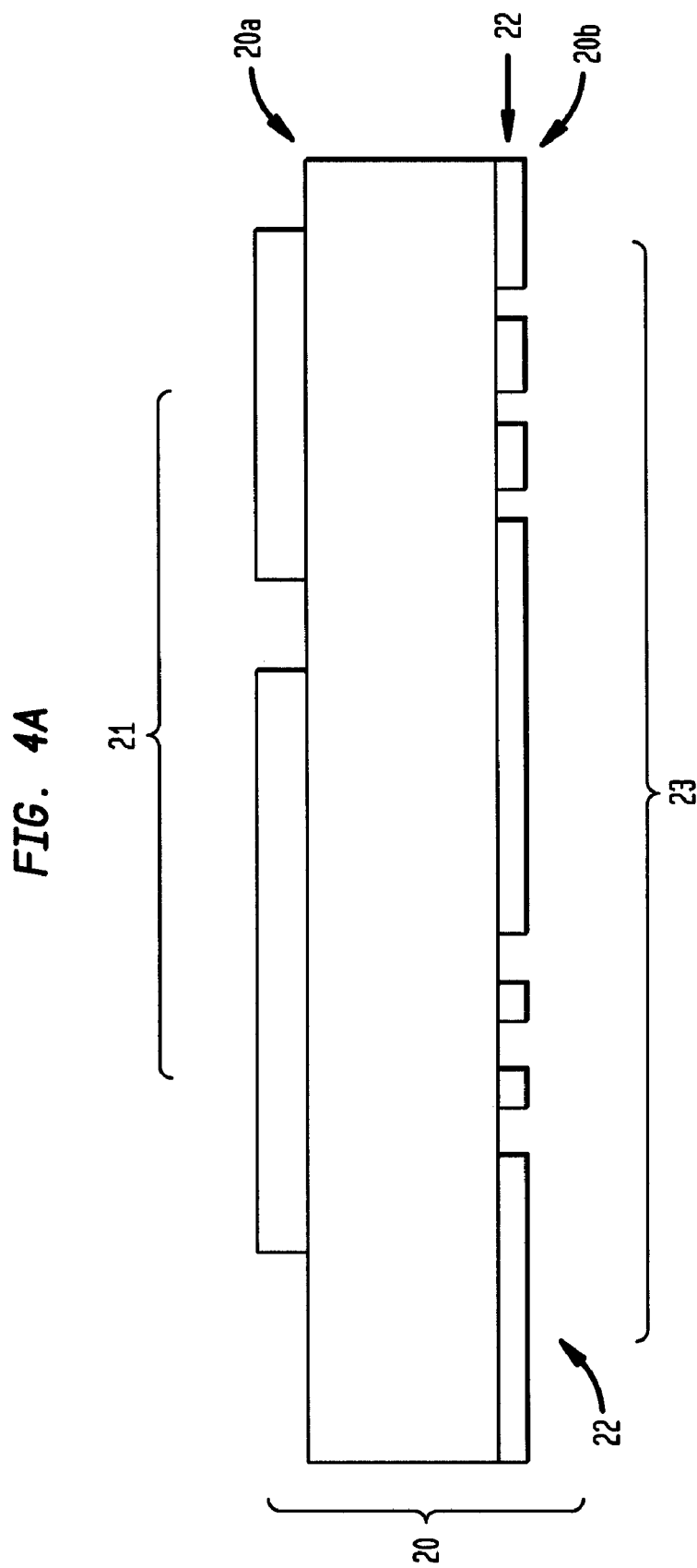
FIG. 4a illustrates a cross-sectional view of another low transmission mask having a thin film with sub-resolution features provided thereon for modifying features of a semiconductor device according to a second embodiment of the systems and methods of the invention.
Figure 5:
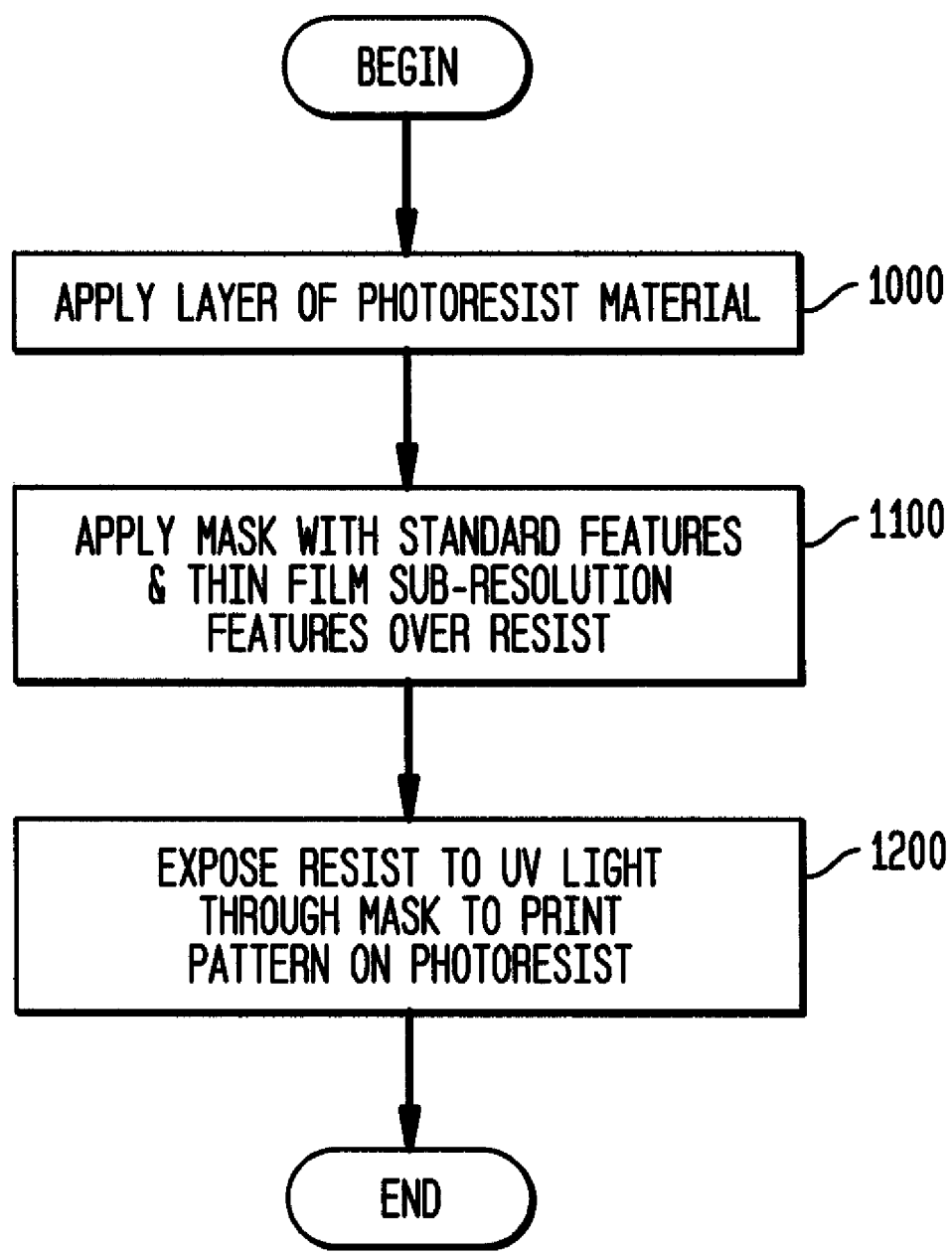
FIG. 5 illustrates a flow chart setting forth the method of modifying features of a semiconductor device using the mask of FIG. 4a according to the systems and methods of the invention.

FIGS. 4a-5 illustrate a second embodiment of modifying features on a semiconductor device 1 according to the systems and methods of the invention. The semiconductor device 1 has a photoresist material 2 coated thereon in conventional manner, the semiconductor device having been cleaned and primed to enhance adhesion of the photoresist to the semiconductor device as practiced in the art. The photoresist can be positive or negative photoresist.

Referring to FIG. 4a, a high transmission mask 20 for use with the semiconductor device 1 of FIG. 1, for example, is illustrated. The high transmission mask 20 is comprised of a chrome side 20a and a non-chrome side 20b in conventional manner. A first or main pattern of standard features 21 (i.e., implicitly intended as comprising, or consisting of, only lithographically resolvable features) is provided on the chrome side 20a of the mask 20, and a second pattern of features is provided by a thin film 22 having sub-resolution features 23 (and as is clearly illustrated in FIG. 4a, only sub-resolution features) on the non-chrome side 20b of the mask 20. When the mask 20 is aligned over the photoresist 2 of the semiconductor device 1 and subjected to an exposure dose of UV light, the first pattern of standard features 21 that would be imparted to the photoresist 2 are modified by the transmission of light through the sub-resolution features 23 of the mask 20. The first pattern of features are thus modified to correspond to the adjustments provided thereto by the second pattern of features through the sub-resolution features of the thin film 23. Thereafter, any soluble photoresist is rinsed away in the case of positive photoresist, or etched away in the case of negative photoresist. The first pattern of features can thus be made to increase or decrease in dimensions according to the UV light transmitted thereto through the sub-resolution features 23 of the thin film of the mask 20. The thin film 23 may be moly silicide, for example, to block all or a percentage, such as 5%, of the UV light transmitted from the exposure dose. The thin film is thus applied to the non-chrome side of the mask 20 in a substantially uniform thickness of approximately 25 Angstroms, for example, although other thicknesses or materials could be used to vary the transmissivity qualities of the thin film, as the artisan should appreciate.

FIG. 4b illustrates a view of a semiconductor device 1 with features imparted thereon the photoresist 2, which is understood to be positive photoresist in this instance. The features imparted to the photoresist 2 in FIG. 4b generally correspond to the first pattern of main features prior to a second exposure. FIG. 4c, on the other hand, illustrates a view of a semiconductor device as modified by the second pattern of features through the sub-resolution features 23 of the mask 20 of FIG. 4a after a second exposure, for example. As shown in FIGS. 4b and 4c, the photoresist 2 of the semiconductor device 1 has a pattern of features corresponding to the masked portions of the positive photoresist 2. Where the sub-resolution features 23 provided additional masking beyond that evident in the chrome side of the mask 20, the solid feature of the positive photoresist is increased. Where the sub-resolution features 23 of the thin film was holed or dotted, for example, to allow UV light to transmit therethrough and onto the photoresist, corresponding portions of soluble photoresist, such as small circular portions of soluble photoresist, are eventually rinsed away after the second exposure. Of course, the artisan will appreciate that other modification patterns, including those accomplished using negative photoresist, are available as well in the discretion of the artisan. In this manner, adjustments to the first main pattern of features may be accomplished using a single exposure dose of UV light.

FIG. 5 illustrates a flowchart of a method of modifying features on a semiconductor device using a mask having a thin film as in FIG. 4a according to a second embodiment of the systems and methods of the invention. Understood in the method set forth in the flowchart of FIG. 5 is that a conventionally cleaned and primed semiconductor device, such as a wafer, is provided prior to applying the photoresist in step 1000 of FIG. 5. Thereafter, in Step 1100 a mask is provided over the photoresist. The mask provides a first main pattern of features on a chrome side thereof, and a thin film having sub-resolution features providing a second pattern of features on a non-chrome side thereof. The second pattern of features modifies the first pattern of features when subjected to an exposure dose of UV light. Then, in Step 1200 an exposure dose of UV light is applied to the photoresist through the mask. That UV light transmitted through the sub-resolution features of the mask modify the first pattern of features to achieve intended linewidth, spacing or other critical dimensions in the photoresist of the semiconductor device, wherein it is understood that any soluble photoresist is thereafter rinsed or etched away, and the semiconductor device with modified features is then hard-baked and further processed in conventional manner. Positive or negative photoresist may be used with the second embodiment of the systems and methods of the invention.

The various exemplary embodiments of the invention as described hereinabove do not limit different embodiments of the present invention. The material described herein is not limited to the materials, designs, or shapes referenced herein for illustrative purposes only, and may comprise various other materials, designs or shapes suitable for the systems and procedures described herein as should be appreciated by one of ordinary skill in the art.

While there has been shown and described what is considered to be preferred embodiments of the invention, it will, of course, be understood that various modifications and changes in form or detail could readily be made without departing from the spirit or scope of the invention. It is therefore intended that the invention be not limited to the exact forms described and illustrated herein, but should be construed to cover all modifications that may fall within the scope of the appended claims.

What is claimed is:

1. A method of modifying features of a semiconductor device with a photoresist thereon, comprising:
   exposing the photoresist to a first exposure dose through a first mask to achieve a first pattern of features; and
   exposing the photoresist to a second exposure dose using sub-resolution features of a second mask that includes only sub-resolution features to modify the first pattern of features into a second pattern of features.

2. The method of claim 1, wherein the second pattern of features modifies different regions of the first pattern of features differently within a common reticle field as a result of the second exposure dose.

3. The method of claim 2, wherein exposing The photoresist through the sub-resolution features further comprises altering the first pattern of features by increasing at least some of the first pattern of features.

4. The method of claim 2, wherein exposing the photoresist through the sub-resolution features further comprises altering the first pattern of features by decreasing at least some of the first pattern of features.

5. The method of claim 2, wherein the sub-resolution features include continuously solid portions, holed or dotted portions, spaced apart portions, slotted portions or combinations thereof.

6. The method of claim 2, wherein the light transmissiveness of the sub-resolution features of the second mask vary.

7. A method of modifying features of a semiconductor device with a photoresist thereon, comprising:
   transmitting an exposure dose to the photoresist though a mask having a first pattern of lithographically resolvable features on one side thereof and a second pattern of only sub-resolution features on another side thereof.

8. The method of claim 7 wherein transmitting the exposure dose through the mask further comprises transmitting the exposure dose through a chrome side of the mask to impart the first set of features onto the photoresist, and transmitting the exposure dose through a thin film having sub-resolution features on the non-chrome side of the mask to modify the first pattern of features according to the second pattern of features according to the sub-resolution features.

9. The method of claim 8, wherein the thin film is comprised of moly silicide.

10. The method of claim 8, wherein the thin film is applied to the non-chrome side of the mask in a thickness of 25 Angstroms.

11. A method of manufacturing a semiconductor device, comprising:
   providing a substrate with a photoresist thereon;
   providing a first mask;
   exposing the photoresist to a first exposure dose through the first mask to achieve a first pattern of features;
   characterizing performance tendencies of the semiconductor device based on the first pattern of features;
   adjusting the first pattern of features to optimize the performance tendencies of the semiconductor device;
   building a second mask that includes only sub-resolution features; and
   exposing the photoresist to a second exposure dose through the second mask to adjust the first pattern of features into a second pattern of features.

12. The method of claim 11, wherein the sub-resolution features average the second exposure dose over the first pattern of features to minimize line roughness.

13. The method of claim 11, wherein the second mask is imaged out of focus to minimize line roughness during exposure dosing.

14. The method of claim 11, wherein adjusting the first pattern of features by the second exposure dose transmitted though the sub-resolution features further comprises increasing at least some of the first pattern of features.

15. The method of claim 11, wherein adjusting the first pattern of features by the second exposure dose transmitted though the sub-resolution features further comprises decreasing at least some of the first pattern of features.

16. The method of claim 11, wherein the photoresist is positive.

17. The method of claim 11, wherein the photoresist is negative.

* * * * *